(12) United States Patent
Lou

(10) Patent No.: US 8,169,227 B2
(45) Date of Patent: May 1, 2012

(54) PROBING APPARATUS WITH MULTIAXIAL STAGES FOR TESTING SEMICONDUCTOR DEVICES

(75) Inventor: Choon Leong Lou, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 428 days.

(21) Appl. No.: 12/552,102

(22) Filed: Sep. 1, 2009

(65) Prior Publication Data
US 2010/0301890 A1   Dec. 2, 2010

(30) Foreign Application Priority Data

May 27, 2009   (TW) ................................ 98117617 A

(51) Int. Cl.
*G01R 31/00* (2006.01)
*G01R 31/02* (2006.01)

(52) U.S. Cl. ............................. 324/750.16; 324/762.01

(58) Field of Classification Search .................... None
See application file for complete search history.

(56) References Cited

U.S. PATENT DOCUMENTS

| 5,861,759 | A | | 1/1999 | Bialobrodski et al. |
| 5,974,662 | A | | 11/1999 | Eldridge et al. |
| 6,037,785 | A | * | 3/2000 | Higgins .................... 324/754.13 |
| 6,762,612 | B2 | * | 7/2004 | Yu et al. ..................... 324/750.17 |
| 7,180,317 | B2 | * | 2/2007 | Hollman ................... 324/750.08 |
| 7,746,089 | B2 | * | 6/2010 | Hobbs et al. ............. 324/750.25 |
| 2006/0071679 | A1 | * | 4/2006 | Gibbs et al. .................... 324/765 |

* cited by examiner

*Primary Examiner* — Vinh Nguyen
(74) *Attorney, Agent, or Firm* — WPAT, P.C.; Anthony King

(57) ABSTRACT

A probing apparatus for testing semiconductor devices comprises a housing configured to define a testing chamber, a device carrier positioned in the housing and configured to receive the semiconductor device, a platen positioned on the housing, an alignment module positioned on the platen, a planarity-adjusting module positioned on the alignment module, an angular adjusting module positioned on the planarity-adjusting module, and a card holder positioned on the angular adjusting module and configured to receive a probe card having a plurality of probes.

19 Claims, 4 Drawing Sheets

PROBING APPARATUS WITH MULTIAXIAL STAGES FOR TESTING SEMICONDUCTOR DEVICES

BACKGROUND OF THE INVENTION (A) Field of the Invention

The present invention relates to a probing apparatus for semiconductor devices, and more particularly, to a probing apparatus equipped with a multiaxial manipulator for testing semiconductor devices such as the integrated circuit devices.

(B) Description of the Related Art

In the manufacturing process of integrated circuit devices, a probe card is used to probe electrical properties to select and discard integrated circuit devices that do not meet the product specifications. Traditionally, the probe card is designed according to the specification and the position of signal pads of the device under test, each probe is positioned on a supporter, and epoxy resin is used to adhere the probe onto the supporter. The probe card is then positioned on a printed circuit board conforming to the device under test. Finally, the position of each probe is precisely adjusted to meet the specification of the device under test in order to carry out accurate and steady electrical testing.

To reduce the test cost, current probe cards are being equipped with increasing numbers of probes to contact multiple integrated circuit devices so that testing can be performed on several devices at the same time. In such an arrangement, it is necessary to planarize the tips of the probes so that all of the probes contact the lead pads of the integrated circuit devices at substantially the same time and same pressure. If planarization is not achieved, some probes establish electrical connections with corresponding lead pads while other probes fail to establish electrical connections, thereby preventing accurate testing of the integrated circuit device. In particular, the lead pads to which excessive pressure is applied may be physically damaged, making it impossible to use the integrated circuit device in a finished product.

U.S. Pat. No. 5,861,759 shows an automatic probe card planarization system to planarize a first plane defined by a plurality of probes relative to a second plane defined by a top surface of a semiconductor wafer. A camera is used to measure the height of at least three selected probes relative to the plane of the wafer. Based on the measured values, the position of the first plane relative to the second plane is adjusted accordingly.

U.S. Pat. No. 5,974,662 shows a method for planarizing probes. The probes are mounted directly on a space transformer. This configuration is such that the orientation of the space transformer, and thus the orientation of the probes, can be adjusted without changing the orientation of the probe card. In this method, an electrically conductive metal plate, instead of the target semiconductor wafer, is provided as a reference plane. A cable and a computer are also provided in such a way that a computer display shows whether a conductive path is created for each probe relative to the metal plate.

SUMMARY OF THE INVENTION

One aspect of the present invention provides a probing apparatus equipped with a multiaxial manipulator for testing semiconductor devices such as the integrated circuit devices.

A probing apparatus for testing semiconductor devices according to this aspect of the present invention comprises a housing configured to define a testing chamber, a device carrier positioned in the housing and configured to receive the semiconductor device, a platen positioned on the housing, an alignment module positioned on the platen, a planarity-adjusting module positioned on the alignment module, an angular adjusting module positioned on the planarity-adjusting module, and a card holder positioned on the angular adjusting module and configured to receive a probe card having a plurality of probes.

Another aspect of the present invention provides a probe card manipulator comprising a base, an alignment module positioned on the base, a planarity-adjusting module positioned on the alignment module, an angular adjusting module positioned on the planarity-adjusting module, and a card holder positioned on the angular adjusting module and configured to receive the probe card having a plurality of probes.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
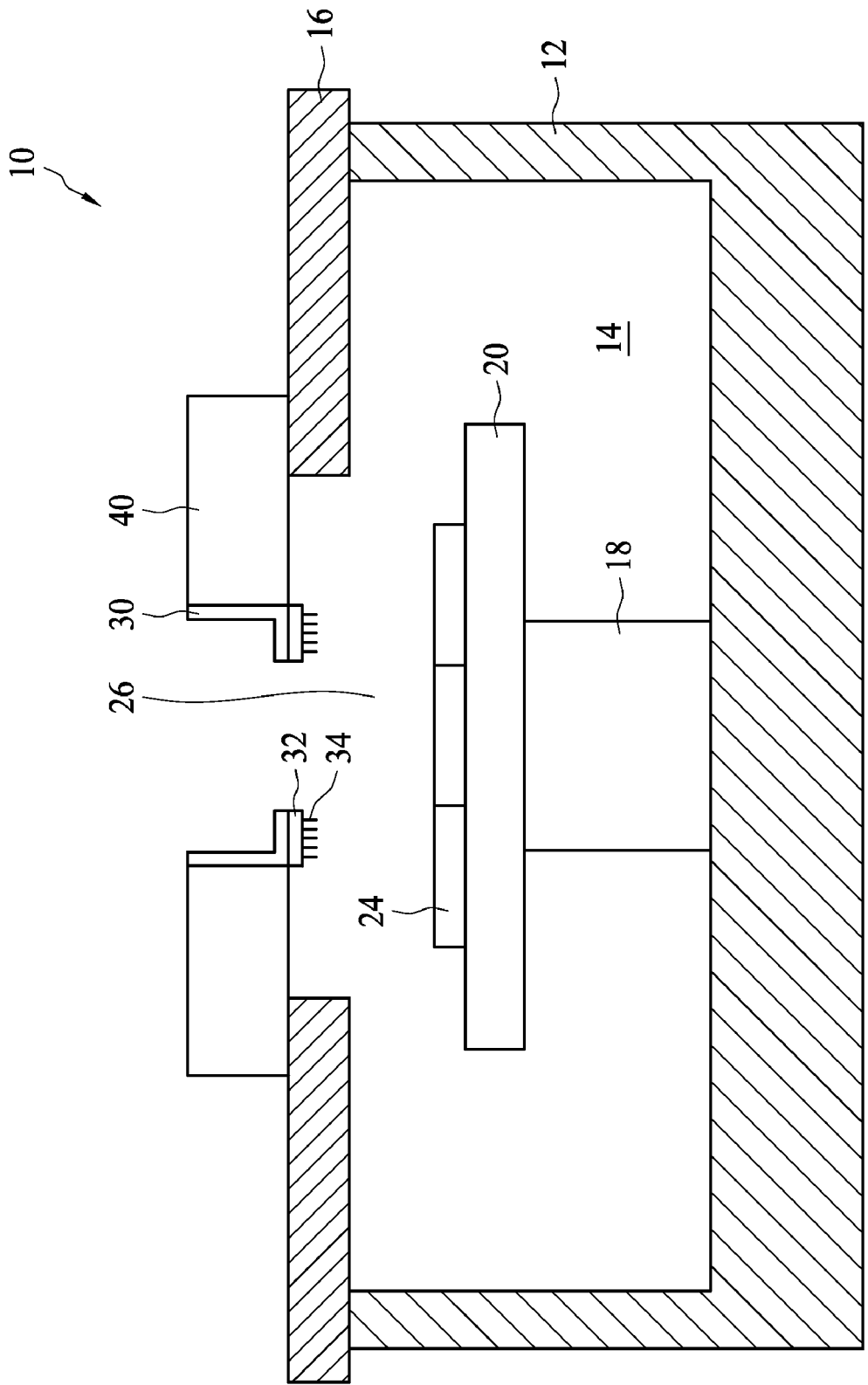
FIG. 1 illustrates a probing apparatus for testing semiconductor devices 24 according to one embodiment of the present invention.

FIG. 1 illustrates a probing apparatus 10 for testing semiconductor devices 24 according to one embodiment of the present invention. The probing apparatus 10 comprises a housing 12 configured to define a testing chamber 14, a stand 18 positioned in the housing 14, a device carrier 20 positioned on the stand 18 and configured to receive the semiconductor device 24 such as the integrated circuit device, a platen 16 having an aperture 26 positioned on the housing 12, a manipulator 40 positioned on the platen 16, and a card holder 30 positioned on the manipulator 40 and configured to receive a probe card 32 having a plurality of probes 34 positioned in an array manner. The probes 34 are configured to contact the semiconductor device 24 through the aperture 26.

Figure 2:
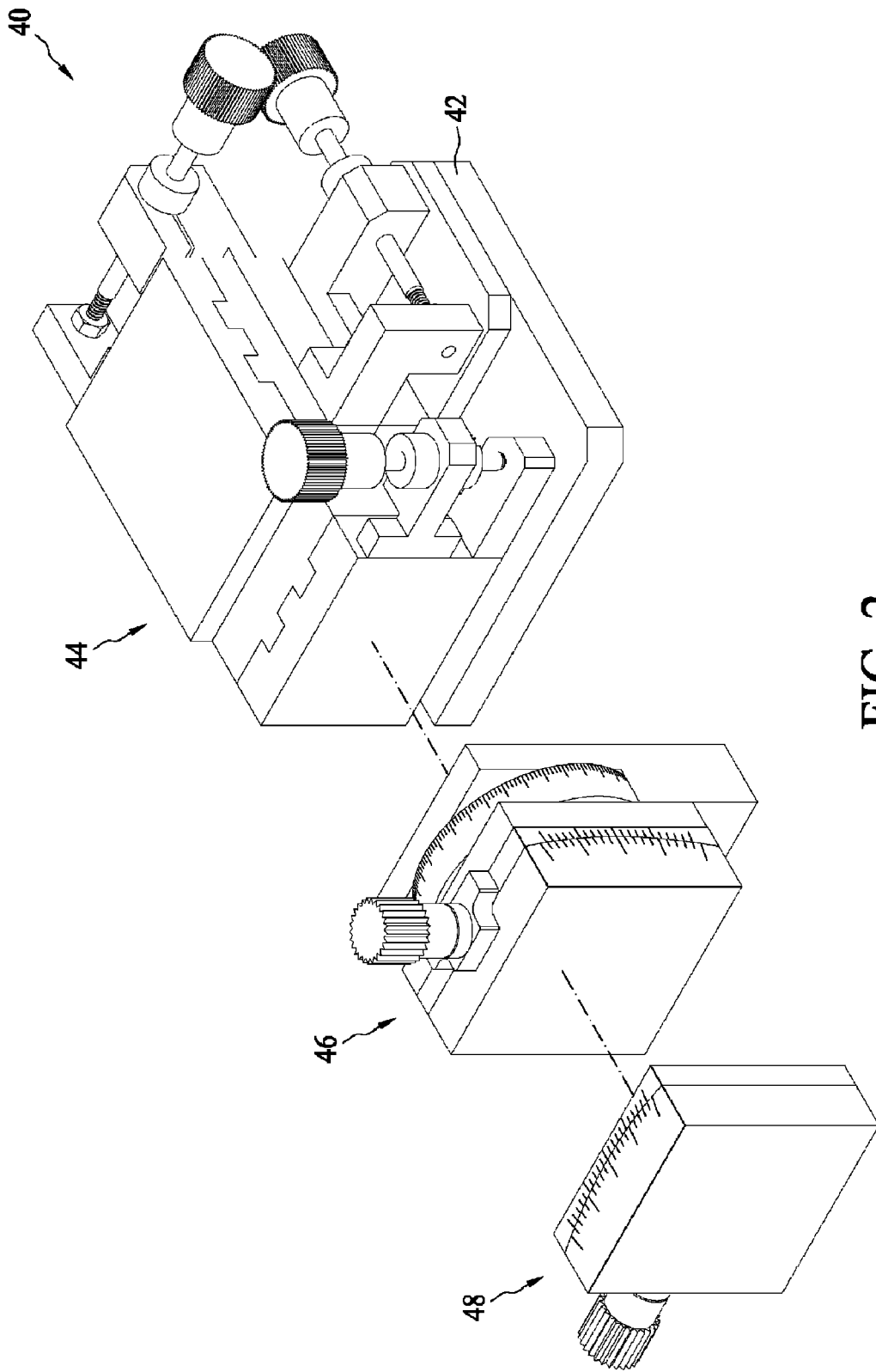
FIG. 2 illustrates the manipulator according to one embodiment of the present invention.

FIG. 2 illustrates the manipulator 40 according to one embodiment of the present invention. The manipulator 40 includes a base 42 configured to attach to the platen 16, an alignment module 44 positioned on the base 42 and configured to adjust the lateral position or vertical position of the probe card 32 to the semiconductor device 24, a planarity-adjusting module 46 positioned on the alignment module 44 and configured to adjust the planarity of the probe card 32, and an angular adjusting module 48 positioned on the planarity-adjusting module 46 and configured to adjust the angle between the probe card 32 and the semiconductor device 24.

Figure 3:
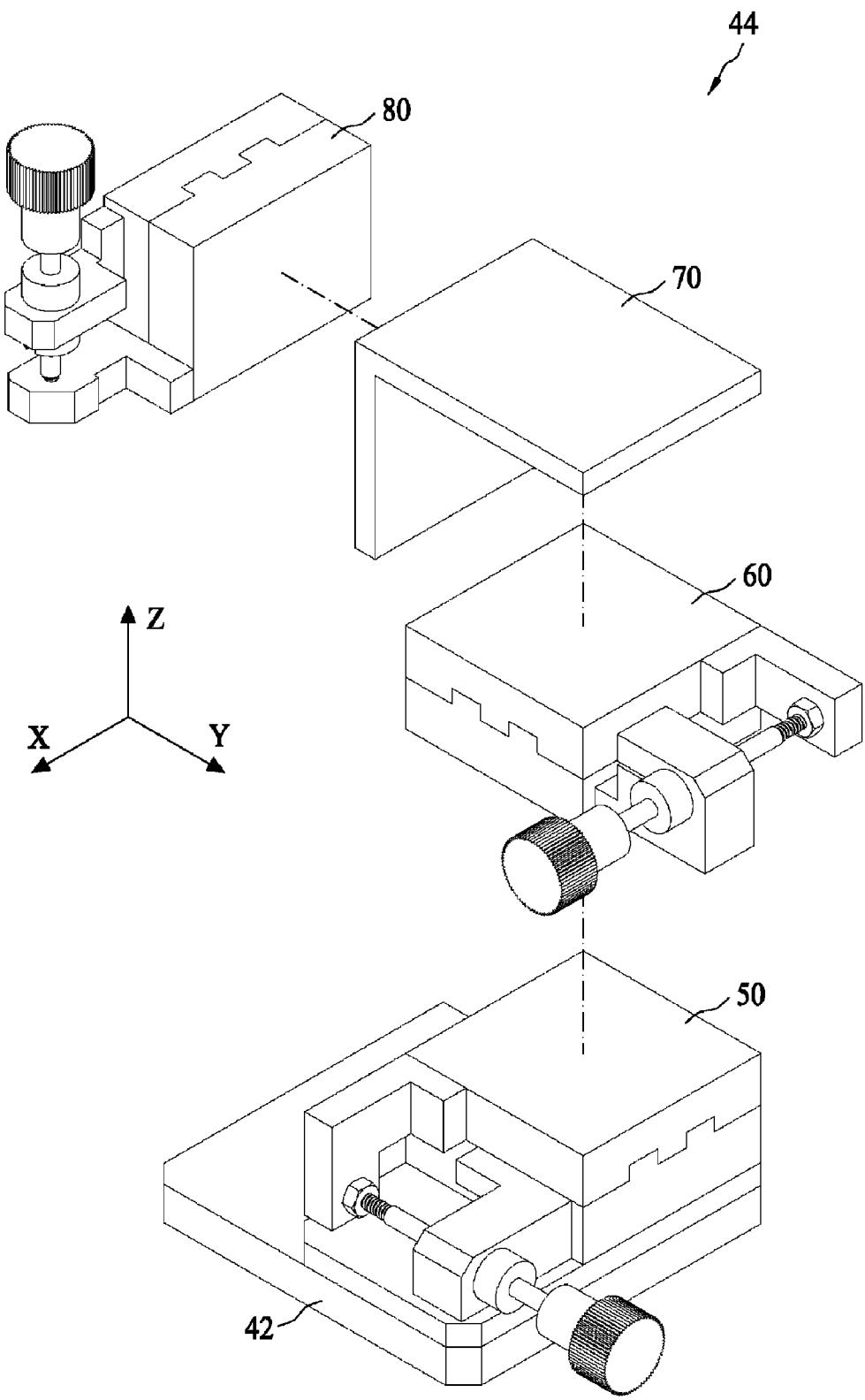
FIG. 3 illustrates the alignment module according to one embodiment of the present invention.

FIG. 3 illustrates the alignment module 44 according to one embodiment of the present invention. The alignment module 44 includes a first driving stage 50 attached to the base 42 and configured to adjust a relative position between the probe card 32 and the semiconductor device 24 along a first axis such as the y-axis, a second driving stage 60 attached to the first driving stage 50 and configured to adjust a relative position between the probe card 32 and the semiconductor device 24 along a second axis such as the x-axis perpendicular to the first axis, and a third driving stage 80 attached to the second driving stage 60 through an L-shaped plate 70 and configured to adjust a relative position between the probe card 32 and the semiconductor device 24 along a third axis such as the z-axis perpendicular to the first axis and the second axis.

Figure 4:
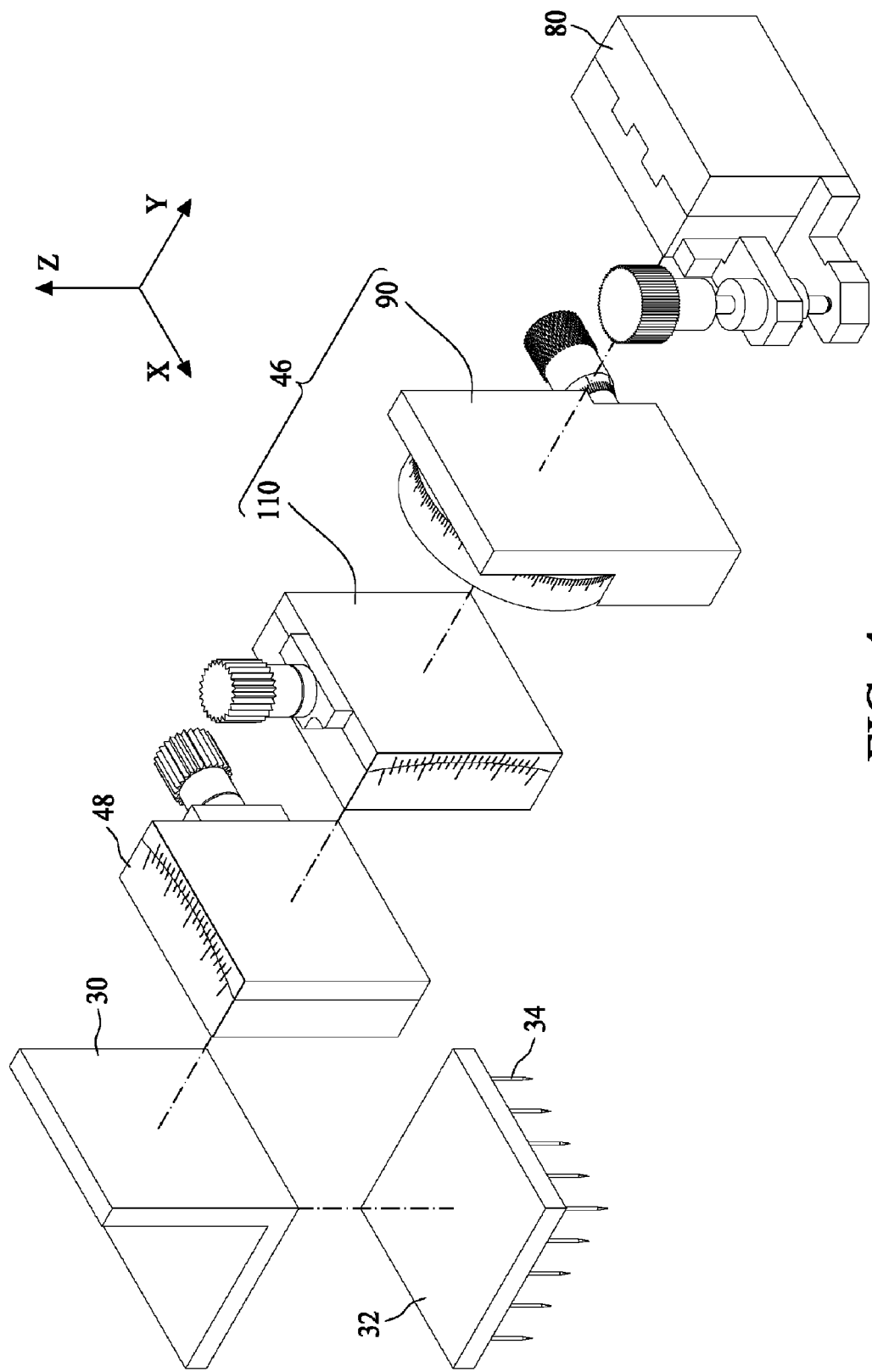
FIG. 4 illustrates the planarity-adjusting module and the angular adjusting module according to one embodiment of the present invention.

FIG. 4 illustrates the planarity-adjusting module 46 and the angular adjusting module 48 according to one embodiment of the present invention. The planarity-adjusting module 46 includes a rotational stage 90 attached to the alignment module 44 and a tilt stage 110 attached to the rotational stage 90. In one embodiment of the present invention, the rotational stage 90 is configured to rotate along the first axis (y-axis), and the tilt stage 110 is configured to rotate along the second axis (x-axis) perpendicular to the first axis (y-axis). The angular adjusting module 48 is a rotational stage configured to rotate along a third axis (z-axis) perpendicular to the first axis (y-axis) and the second axis (z-axis). In one embodiment of the present invention, the angular adjusting module 48 is configured to adjust an angle between the probe card 32 and the semiconductor device 24 by rotating the card holder 30.

According to one embodiment of the present invention, the manipulator 40 can be operated according to the following process to conduct the electrical test of the semiconductor device 24. The planarity-adjusting module 46 adjusts the planarity of the probes 34; the angular adjusting module 48 adjusts the angle between the probe card 32 and the semiconductor device 24 by rotating the card holder 30; the first driving stage 50 and the second driving stage 60 adjust the lateral position of the probe card 30 relative to the semiconductor device 24; and the third driving stage 80 lowers the probe card 30 such that the probes contact the semiconductor device 24. In particular, as the planarity-adjusting module 46 completes the planarity adjustment, the manipulator 40 not only ensures the establishment of the electrical connection between the probes 34 and the semiconductor device 24, but also prevents the semiconductor device 24 from being physically damaged by too much pressure from the probes 34 due to a lack of planarity of the probes 34.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A probing apparatus for testing semiconductor devices, comprising:
    a housing configured to define a testing chamber;
    a device carrier positioned in the housing and configured to receive the semiconductor device;
    a platen positioned on the housing;
    an alignment module positioned on the platen;
    a planarity-adjusting module positioned on the alignment module;
    an angular adjusting module positioned on the planarity-adjusting module; and
    a card holder positioned on the angular adjusting module and configured to receive a probe card having a plurality of probes.

2. The probing apparatus for testing semiconductor devices of claim 1, wherein the probes are positioned in an array manner.

3. The probing apparatus for testing semiconductor devices of claim 1, wherein the alignment module includes:
    a first driving stage configured to adjust a relative position between the probe card and the semiconductor device along a first axis;
    a second driving stage configured to adjust a relative position between the probe card and the semiconductor device along a second axis perpendicular to the first axis; and
    a third driving stage configured to adjust a relative position between the probe card and the semiconductor device along a third axis perpendicular to the first axis and the second axis.

4. The probing apparatus for testing semiconductor devices of claim 3, wherein the second driving stage is attached to the first driving stage.

5. The probing apparatus for testing semiconductor devices of claim 3, wherein the third driving stage is attached to the second driving stage through an L-shaped plate.

6. The probing apparatus for testing semiconductor devices of claim 1, wherein the planarity-adjusting module includes:
    a rotational stage attached to the alignment module; and
    a tilt stage attached to the rotational stage.

7. The probing apparatus for testing semiconductor devices of claim 6, wherein the rotational stage is configured to rotate along a first axis, and the tilt stage is configured to rotate along a second axis perpendicular to the first axis.

8. The probing apparatus for testing semiconductor devices of claim 7, wherein the angular adjusting module is configured to rotate along a third axis perpendicular to the first axis and the second axis.

9. The probing apparatus for testing semiconductor devices of claim 1, wherein the angular adjusting module is a tilt stage configured to adjust an angle between the probe card and the semiconductor device by rotating the card holder.

10. The probing apparatus for testing semiconductor devices of claim 1, wherein the platen includes an aperture, and the probes are configured to contact the semiconductor device through the aperture.

11. A probe card manipulator, comprising:
    a base;
    an alignment module positioned on the base;
    a planarity-adjusting module positioned on the alignment module;

an angular adjusting module positioned on the planarity-adjusting module; and a card holder positioned on the angular adjusting module and configured to receive the probe card having a plurality of probes.

12. The probe card manipulator of claim 11, wherein the probes are positioned in an array manner.

13. The probe card manipulator of claim 11, wherein the alignment module includes:

a first driving stage configured to adjust a relative position between the probe card and the semiconductor device along a first axis;

a second driving stage configured to adjust a relative position between the probe card and the semiconductor device along a second axis perpendicular to the first axis; and a third driving stage configured to adjust a relative position between the probe card and the semiconductor device along a third axis perpendicular to the first axis and the second axis.

14. The probe card manipulator of claim 13, wherein the second driving stage is attached to the first driving stage.

15. The probe card manipulator of claim 13, wherein the third driving stage is attached to the second driving stage through an L-shaped plate.

16. The probe card manipulator of claim 11, wherein the planarity-adjusting module includes:

a rotational stage attached to the alignment module; and a tilt stage attached to the rotational stage.

17. The probe card manipulator of claim 16, wherein the rotational stage is configured to rotate along a first axis, and the tilt stage is configured to rotate along a second axis perpendicular to the first axis.

18. The probe card manipulator of claim 17, wherein the angular adjusting module is configured to rotate along a third axis perpendicular to the first axis and the second axis.

19. The probe card manipulator of claim 11, wherein the angular adjusting module is a tilt stage configured to adjust an angle between the probe card and the semiconductor device by rotating the card holder.

* * * * *